(12) United States Patent
Jameson et al.

(10) Patent No.: US 9,177,639 B1
(45) Date of Patent: Nov. 3, 2015

(54) MEMORY DEVICES, CIRCUITS AND METHODS HAVING DATA VALUES BASED ON DYNAMIC CHANGE IN MATERIAL PROPERTY

(75) Inventors: John Ross Jameson, Burlingame, CA (US); Shane Charles Hollmer, Grass Valley, CA (US); Nad Edward Gilbert, Gilbert, AZ (US)

(73) Assignee: Adesto Technologies Corporation, Sunnyvale, CA (US)

( * ) Notice: Subject to any disclaimer, the term of this patent is extended or adjusted under 35 U.S.C. 154(b) by 292 days.

(21) Appl. No.: 13/315,652

(22) Filed: Dec. 9, 2011

Related U.S. Application Data

(60) Provisional application No. 61/421,588, filed on Dec. 9, 2010.

(51) Int. Cl.
  *G11C 11/00* (2006.01)
  *G11C 13/00* (2006.01)

(52) U.S. Cl.
  CPC ........ *G11C 13/0004* (2013.01); *G11C 13/0069* (2013.01)

(58) Field of Classification Search
  CPC ........... G11C 13/0004; G11C 13/0069; G11C 11/5678
  USPC ............... 365/163, 185.21, 63, 148, 171, 172
  See application file for complete search history.

(56) References Cited

U.S. PATENT DOCUMENTS

| | | |
|---|---|---|
| 5,761,115 A | 6/1998 | Kozicki et al. |
| 6,487,106 B1 | 11/2002 | Kozicki |
| 6,635,914 B2 | 10/2003 | Kozicki et al. |
| 7,106,614 B2 | 9/2006 | Symanczyk |
| 7,126,152 B2 | 10/2006 | Ishida et al. |
| 7,167,390 B2 | 1/2007 | Ishida et al. |
| 7,209,379 B2 | 4/2007 | Mori et al. |
| 7,239,542 B2 | 7/2007 | Ootsuka et al. |
| 7,242,606 B2 | 7/2007 | Hachino et al. |
| 7,359,236 B2 | 4/2008 | Gilbert |
| 7,411,854 B2 | 8/2008 | Klostermann et al. |
| 7,426,131 B2 | 9/2008 | Gilbert |
| 7,457,145 B2 | 11/2008 | Kund et al. |
| 7,514,706 B2 | 4/2009 | Gilbert |
| 7,535,756 B2 * | 5/2009 | Lung .............................. 365/163 |
| 8,406,033 B2 * | 3/2013 | Lung et al. .................... 365/148 |
| 8,654,561 B1 * | 2/2014 | Jameson et al. .............. 365/148 |
| 8,681,532 B2 * | 3/2014 | Murooka ....................... 365/148 |
| 2006/0139989 A1 | 6/2006 | Gruning Von Schwerin et al. |
| 2010/0195370 A1 | 8/2010 | Shiimoto et al. |

* cited by examiner

*Primary Examiner* — Connie Yoha

(57) ABSTRACT

A method can include determining a data value stored in a memory element of a memory cell array based on the length of time required to cause a property of the memory element to change. A memory device can include a plurality of elements programmable into at least two different states; and an electrical bias section that applies sense conditions to a selected element; and a sense section configured to distinguish between the two different states according to whether a change in property occurs in the selected element within a predetermined time under the sense conditions.

9 Claims, 12 Drawing Sheets

MEMORY DEVICES, CIRCUITS AND METHODS HAVING DATA VALUES BASED ON DYNAMIC CHANGE IN MATERIAL PROPERTY

This application claims the benefit of U.S. Provisional Patent Application Ser. No. 61/421,588 filed on Dec. 9, 2010, the contents of which are incorporated by reference herein.

TECHNICAL FIELD

The present disclosure relates generally to memory devices, and more particularly to memory devices having memory elements that exhibit dynamic changes in impedance during read operations.

BACKGROUND

Memory devices typically include memory elements for storing data. "Flash" electrically erasable and programmable read only memories (EEPROMs) can include an electrical storage gate layer for altering a transistor threshold voltage. Thus, such devices can sense data values based on a transistor threshold voltage.

Devices having one time programmable elements, such as "anti-fuse" elements, can program an element by creating a non-reversible conductive path. Thus, such devices can sense data values based on the resistance of the cell.

Conventional conductive bridge random access memories (CBRAMs) include memory elements (sometimes referred to as programmable metallization cells (PMCs)) that are programmed and erased to different resistance levels. Many conventional CBRAM elements have a metal-insulator-metal (MIM) structure. In one state (e.g., erased), substantially no current can flow through the MIM structure. In another state (e.g., programmed), a conductive path can be formed through the insulator layer. Accordingly, such memory devices can sense data values based on a resistance of a storage element (e.g., PMC).

In all of these conventional examples, the sense operations measure a property of the memory cell that remains substantially unchanged over the duration of the operation. Other operations, typically called "write" (or program) and "erase," are employed to change the value of the property that is to be sensed. Likewise, such conventional read operations rely on the property being sensed remaining substantially unchanged in between read operations. Changes that do occur can be considered "errors," and additional "correction" operations can be employed to return the property of the cell to its intended value. In contrast, write and erase operations (but not read operations), a property to be sensed can change over time to establish static state to be sensed.

DETAILED DESCRIPTION

Below embodiments show methods and devices for storing data based on a timed change in a property of a memory element. Unlike conventional approaches that can determine a stored data values based on a static characteristic of a memory cell (e.g., threshold voltage, resistance), embodiments can sense a data value by determining the length of time required to cause a property of a cell to change. Accordingly, in contrast to static property memories mentioned above, a definite, one-to-one relationship can exist between the data value of the cell and the time required to cause a property of the cell to change. However, no definite relationship needs to exist between the data value of the cell and the value of the property itself or the value of the change in the property.

In some embodiments, a memory cell can include a metal-insulator-metal (MIM) type element, and the property of the cell that can change in a read operation can be the existence or nonexistence of an electrically conductive filament between the two (metal) electrodes. In some embodiments, an electrical voltage can be used to bring the filament into or out of existence. In one embodiment, an electrical conductance of the cell can differ depending on whether or not (or to what extent) a filament exists, and an electrical circuit can use this change in conductance to measure the time required to bring the filament into or out of existence. However, other embodiments can involve different properties of a cell, different techniques for changing those properties, and different techniques for measuring the time required to do so. That is, embodiments can store values based on the time required to change a property other than conductance.

In some embodiments, memory device can include two terminal storage elements that can be written (e.g., programmed) between two or more different states. However, unlike other memory types, each state corresponds to a dynamic response, rather than a static value. In particular, under the same sense bias conditions, an element having one state can undergo a change in property within a time period, while an element in another state cannot undergo such a change in conductance within the same time period.

In some embodiments, a change in property can involve a change from one resistance to a lower resistance. However, in other embodiments, elements can change from a lower resistance to a higher resistance, or can exhibit changes in capacitance.

Memory elements according to embodiments herein can be programmed between different states multiple times. That is, such elements are not one time programmable.

Figure 1:
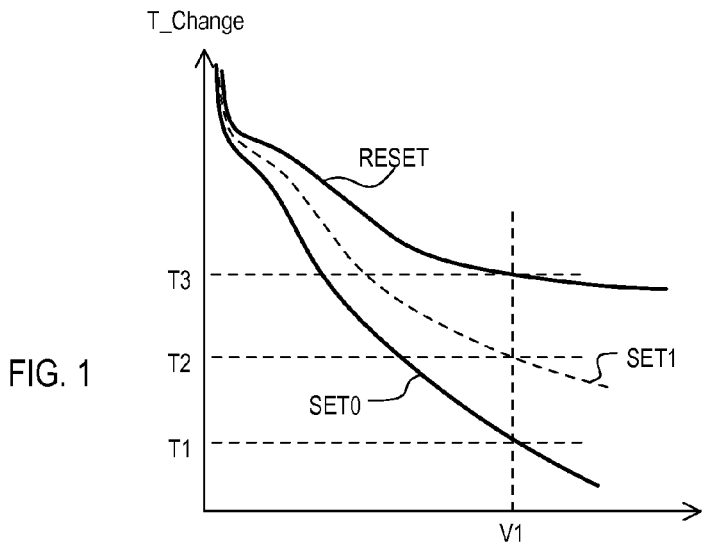
FIG. 1 shows responses of a memory element according to an embodiment.

FIG. 1 shows responses of a memory element according to an embodiment. FIG. 1 is a graph showing a change time (T_Change) versus a sense voltage (Vsense). Vsense can be a voltage applied to an element to induce a change in property. T_Change can be the amount of time required to induce the property change under a given sense voltage. A value T_change can vary according to an initial state of the memory element.

The embodiment of FIG. 1 shows three initial element states: SET0, SET1 and RESET. As shown, for a Vsense value of V1, each different state results in a different T_Change. In particular, states SET0, SET1 and RESET can have T_Change values of T1, T2 and T3, respectively.

In some embodiments, an element can be a two terminal device that can be programmed into a particular state (e.g., SET, RESET) in response to the application of an electric field. In a very particular embodiment, an element can have an MIM type structure.

In some embodiments, a property change can be detected by an electrical property change in an element, including a sensed change in current drawn through the memory element.

FIGS. 2A to 2D show a sensing operation of a memory element according to an embodiment. In the embodiment shown, it is assumed that a memory element 200 can be a two terminal device.

Figures 2A, 2B, 2C, 2D:
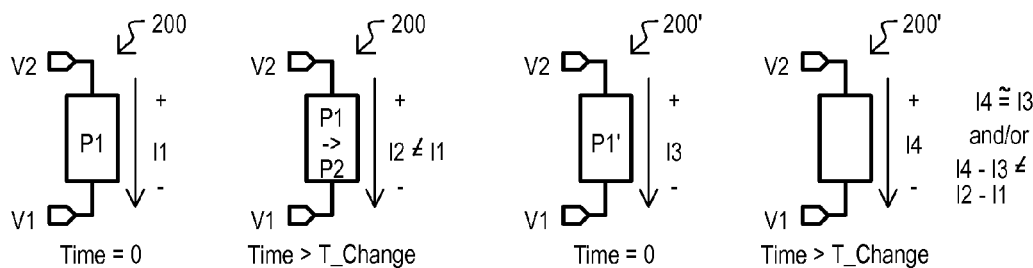
FIGS. 2A to 2D show a sensing operation of a memory element according to an embodiment.

FIGS. 2A and 2B show a response that can correspond to a first state, which can represent a first data value.

FIG. 2A shows an initial part of a sense operation. A sense voltage V2-V1 can be applied across element 200. Initially (Time=0), an element can have a first property. A current I1 can flow through the device. It is understood that in some embodiments, I1 can be substantially zero.

FIG. 2B shows element 200 after a change time has passed (Time>T_Change). In the embodiment shown, a property of element 200 can undergo a dynamic change in response to sense conditions. Such a change in property can be reflected by a dynamic change in current through the element 200, with a current changing from I1 to I2, where I2≠I1.

FIGS. 2C and 2D show a response that can correspond to a second state, which can represent a second data value different from that of FIGS. 2A and 2B.

FIG. 2C shows an initial part of a sense operation. As in the case of FIG. 2A, a sense voltage V2-V1 can be applied across element 200'. Initially (Time=0), an element can have a first property. A current I3 can flow through the device. It is noted that current I3 can be the same as I1 in FIG. 2A, or can be different than I1.

FIG. 2D shows element 200' after a change time has passed (Time>T_Change). A current I4 can now flow through the element. As shown, application of the sense voltage V2-V1 has resulted in a change different from that of FIGS. 2A and 2B. A current flowing through element 200' can be about the same as at time t0 (i.e., I4≅I3) (i.e., substantially no change has occurred), or a current change can be different than that occurring in FIGS. 2A to 2B (i.e., I4-I3≠I2-I1).

In this way, a memory element can be a two terminal element programmable to have different changes in property within a time period. In very particular embodiments, such a property change can be detected according to a change in current flowing through a memory element.

Figure 3:
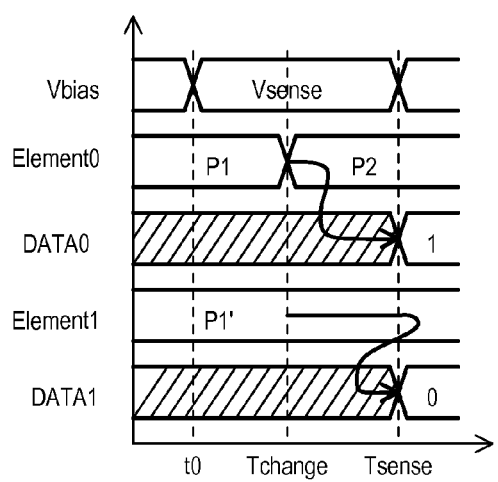
FIG. 3 is a timing diagram showing a sense operation according to an embodiment.

Referring now to FIG. 3, a timing diagram shows a sensing operation. In a particular embodiment, the sensing operation of FIG. 3 can be one representation of that shown in FIGS. 2A-2D. FIG. 3 shows a waveform Vbias, which corresponds to a sense voltage applied to memory elements in a sense operation. A waveform Element0 shows a property response of an element having one state (e.g., SET), while waveform Element1 shows a property response of an element having a second state (e.g., RESET). Waveform DATA0 shows a data value corresponding to Element0, waveform DATA1 shows a data value corresponding to Element1.

At about time t0, a sense operation can start as a voltage Vsense is applied to the memory elements. At this time, a property of both elements can have initial values P1 and P1'. It is noted that P1 can be the same as P1' or can be different than P1'. It is noted that in some embodiments, absolute values of properties do not establish the value of a stored data value. Rather, data values are determined according to changes property over time. In such embodiments, an initial state and/or a final state of an element does not, by itself, determine a stored data value.

At time Tchange, Element0 can undergo a change in property, changing to a property P2. However, Element1 does not undergo a change in property, maintaining property P1'.

At about time Tsense, any change (or lack of change) in property sensed can generate corresponding output data values. Because Element0 undergoes a change in property, it can generate one output data value (in this case "1"). However, because Element1 does not undergo a change in property, it can generate another output data value (in this case "0").

In this way, a memory device can determine a data value stored by a memory element by detecting a change in property within a predetermined time period.

Figures 4A, 4B, 4C:
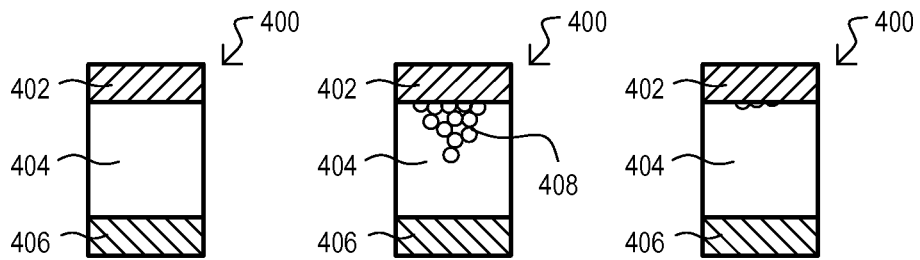
FIGS. 4A to 4C show a memory element read operation according to one embodiment.

FIGS. 4A to 4C show a memory element read operation according to one embodiment. A memory element 400 can have a first electrode 402, a second electrode 406, and a memory layer 404. In one particular embodiment, FIGS. 4A to 4C can be one implementation of a memory element like that shown in FIGS. 2A to 2C.

FIG. 4A shows an initial part of a sense operation, when a sense bias is initially applied across electrodes 402 and 406. At this time, there can be substantially no conductive filament between electrodes 402 and 406, and a memory element 400 can have an initial property. That is, a memory layer 404 can act as a substantially insulating material.

FIG. 4B shows element 400 after a change time has passed (Time>T_Change). In the embodiment shown, in response to the sense voltage being applied over time, conductive filament(s) 408 can have formed within memory layer 404. Conductive filament(s) 408 can be an increased density of a conductive material within memory layer 404. In the embodiment shown, accumulation can occur in the vicinity of one electrode 402. Such an accumulation can alter the properties of memory element 400. The detection of such a change in property can be sensed as one data type.

FIG. 4C shows how element 400 can be returned to have initial properties, or substantially initial properties (i.e., properties like that of FIG. 4A). In some embodiments, a voltage opposite to the sense voltage can be applied to the element 400.

It is noted that in the embodiment of FIG. 4A to 4C, conductive elements 408 do not form a conductive filament spanning the electrodes 402 and 406.

Figures 5A, 5B, 5C:
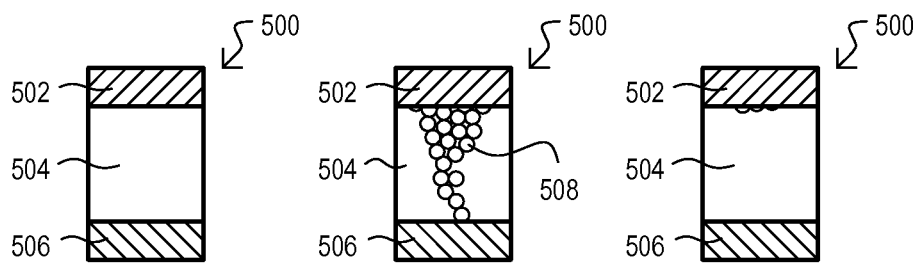
FIGS. 5A to 5C show a memory element read operation according to another embodiment.

FIGS. 5A to 5C show a memory element read operation according to another embodiment. A memory element 500 can have a first electrode 502, a second electrode 506, and a memory layer 504. In one particular embodiment, FIGS. 5A to 5C can be one implementation of a memory element like that shown in FIGS. 2A to 2C. FIGS. 5A to 5C show operations corresponding to FIGS. 4A to 4C, respectively.

However, the embodiment of FIGS. 5A to 5C varies from that of FIGS. 4A to 4C in that conductive filament(s) 508 can span electrodes 502 and 506, as represented by FIG. 5B. Consequently, following a time T_change, a change in property can include the formation of a conductive path through memory layer 504.

Figures 6A, 6B, 6C:
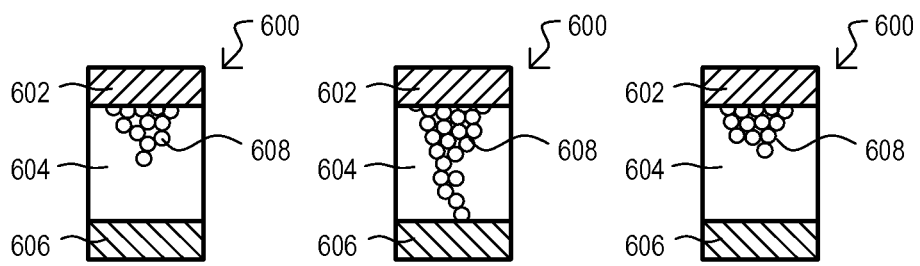
FIGS. 6A to 6C show a memory element read operation according to a further embodiment.

FIGS. 6A to 6C show a memory element read operation according to a further embodiment. A memory element 600 can have a first electrode 602, a second electrode 606, and a memory layer 604. In one particular embodiment, FIGS. 6A to 6C can be one implementation of a memory element like that shown in FIGS. 2A to 2C.

FIGS. 6A to 6C show operations corresponding to FIGS. 5A to 5C. However, the embodiment of FIGS. 6A to 6C varies from that of FIGS. 5A to 5C in that a conductive filament(s) 608 can already have some local increase in density prior to the sense operation. Thus, as shown in FIG. 6A, at the start of sense operation, conductive filament(s) 608 can have formed a local structure (in this case the vicinity of electrode 602).

FIG. 6B shows the formation of a filament spanning the electrodes.

FIG. 6C shows how a conductivity of an element can be reversed to substantially an initial conductivity (i.e., like that of FIG. 6A).

Figures 7A, 7B, 7C:
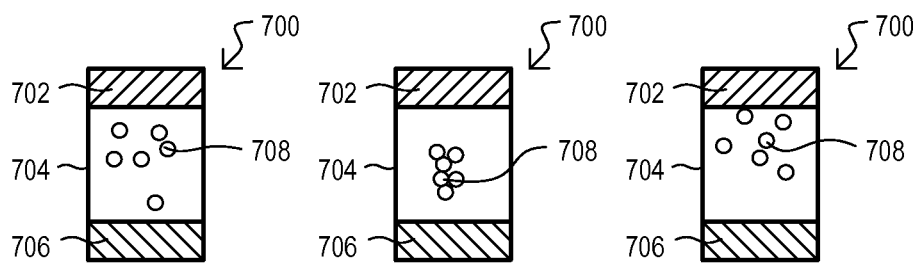
FIGS. 7A to 7C show a memory element read operation according to still another embodiment

FIGS. 7A to 7C show a memory element read operation according to still another embodiment. A memory element 700 can have a first electrode 702, a second electrode 706, and a memory layer 704. In a particular embodiment, FIGS. 7A to 7C can be one implementation of a memory element like that shown in FIGS. 2A to 2C.

FIGS. 7A to 7C show operations corresponding to FIGS. 4A to 4C. However, the embodiment of FIGS. 7A to 7C varies from that of FIGS. 4A to 4C in that a memory layer 704 can have conductive elements 708 dispersed within.

FIG. 7A shows an initial part of a sense operation, when a sense bias is initially applied. At this time, conductive elements 708 can have some distribution within memory layer 704.

FIG. 7B shows element 700 after a change time has passed (Time>T_Change). In the embodiment shown, in response to the sense voltage being applied over time, conductive elements 708 can accumulate within a localized region of memory layer 704. Such an accumulation can decrease a resulting resistance of memory element 700. The detection of such a change in resistance can be sensed as one data type.

FIG. 7C shows how element 700 can be returned to an initial conductivity.

In some embodiments, a memory layer (e.g., 404, 504, 604 and/or 704) can be a substantially homogeneous layer, or can include multiple layers for constraining or otherwise controlling how conductive elements accumulate within the insulating layers.

In very particular embodiments, a memory element can include a chalcogenide material formed between two conductive layers, with metallic atoms forming the conductive elements within the chalcogenide. In a very particular embodiment, a memory element can include a silver electrode, a tungsten electrode and a layer of germanium disulfide ($GeS_2$) as an insulating layer. Silver ions can form the conductive elements within the $GeS_2$. In alternate embodiments, a memory layer can include a metal oxide, in place of, or in addition to a chalcogenide material. In very particular embodiments, such a metal oxide can be a transition metal oxide.

Accordingly, in some embodiments, an insulating layer can be an ion conducting layer, and changes in conductivity can arise from micro-/nano-structural changes arising from ion mobility due to an applied electric field.

As noted above, according to embodiments, memory elements can store data values according to dynamic changes in properties. In the various following embodiments it is assumed that an element property can be a conductance through the element that may or may not exhibit a change within a sense time period.

Figure 8:
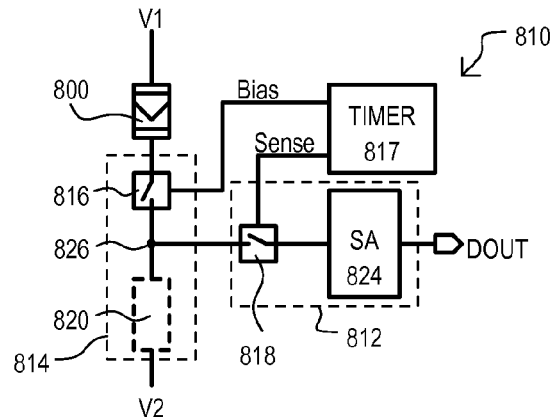
FIG. 8 is a block schematic diagram of a memory device according to an embodiment.

FIG. 8 shows a memory device 810 according to an embodiment. A memory device 810 can include a memory element 800, a sense section 812, a bias section 814, and a timer circuit 817.

A memory element 800 can be programmable to either undergo, or not undergo a change in property within a time T_change under sense bias conditions, as described herein, or equivalents.

A bias section 814 can apply sense bias conditions to a memory element 800 in response to timer circuit 817. In particular, sense bias conditions can be applied for a time T_Change. In the very particular embodiment of FIG. 8, a bias section 814 can include a bias switch 816 and optionally, a load circuit 820. When bias switch 816 is enabled (e.g., conducting), bias conditions can be applied across memory element 800. A load circuit 820 can be passive or active.

A sense section 812 can determine whether or not a change in property has occurred within a memory element 800. In particular, after bias conditions have been applied to memory element 800 for time T_Change, a sense section 812 can check for a change in property. In the very particular embodiment of FIG. 8, a sense section 812 can include a sense switch 818 and a sensing circuit 824. When sense switch is enabled, a sensing circuit 824 can determine if a change in property has occurred in a sensed element from a voltage at, and/or a current flowing through, a sense node 826, as such a voltage/current can vary as properties of memory element 800 vary.

A timer circuit 817 can provide signals for enabling bias section 814 and sensing section 812. In the embodiment shown, a timer circuit 817 can activate signal Bias for a time T_Change, to apply bias conditions to memory element. Subsequently, signal Sense can be activated to sense any change in property in the memory element.

In this way, a memory device can include bias circuits that apply sense bias conditions and sense circuits that sense any property changes arising from the bias conditions during a sense time.

Figure 9A:
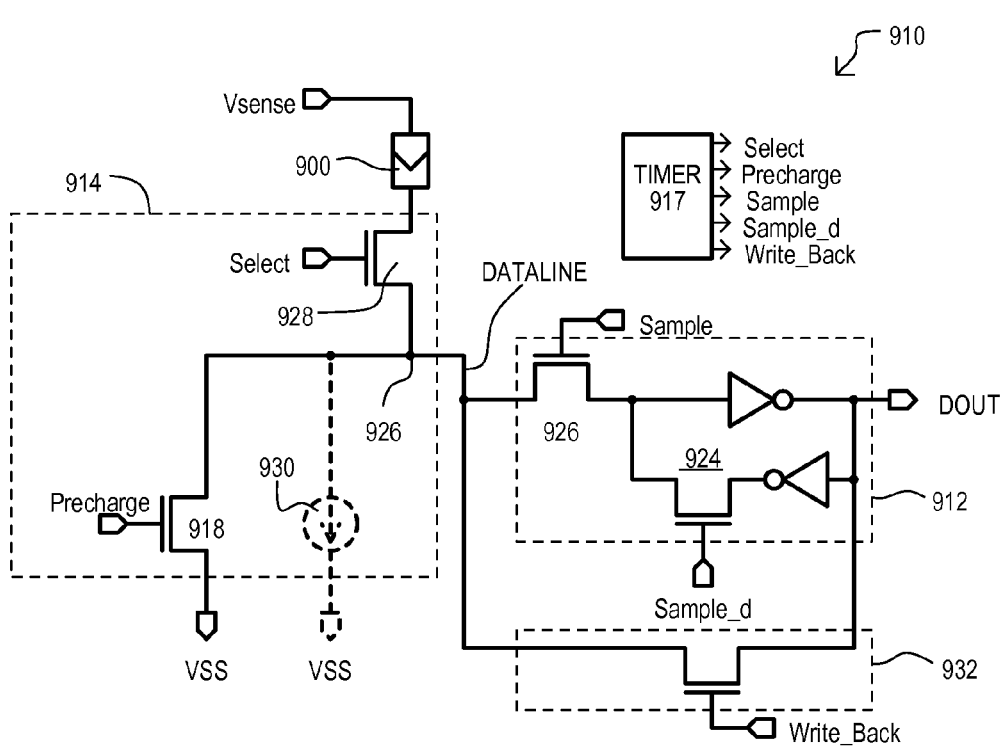
FIG. 9A is a block schematic diagram of a memory device according to a further embodiment.

FIG. 9A shows a memory device 910 according to a further embodiment. A memory device 900 can include items like those in FIG. 8, and such like items are referred to by the same reference characters, but with the first digit being an "9" instead of "8". In one particular embodiment, FIG. 9A can be on implementation of memory device 810 shown in FIG. 8.

In memory device 910, a bias section 914 can include a precharge switch 918 and a select switch 928. A precharge switch 918 can precharge a sense node 926 to a potential (in this case VSS). A select switch 928 can connect a memory element 900 to a sense node 926. When precharge switch 918 and select switch 928 are enabled, bias conditions (e.g., Vsense-VSS) can be applied across memory element 900.

In an alternate embodiment, a bias section 914 can include a current source circuit 930 in place of precharge switch 918. In such an arrangement, when select switch 928 is enabled, bias conditions can be applied across memory element 900 that vary according to current source circuit 930. A current source circuit 930 can be operated to provide a desired bias level to sense node 926.

In memory device 910, a sense section 912 can include a sense switch 926 and sense circuit 924, which in this embodiment can be a latch.

Optionally, a memory device 910 further includes a write back circuit 932. Following a data sensing operation, a write back circuit 932 can apply a voltage across memory device 900 that can reinforce and/or reestablish its initial state.

A timer circuit 917 can generate signals Select, Precharge, Sample, Sample_d and, optionally, Write_Back. Signal Select can enable select switch 928. Signal Precharge can enable precharge switch 918. Signal Sample can enable sense switch 926. Signal Sample_d can be a delayed version of Sample for enabling a latching operation within sense circuit 924. Signal Write_Back can enable write back circuit 932, connecting an output of sense circuit 924 to sense node 926.

Figure 9B:
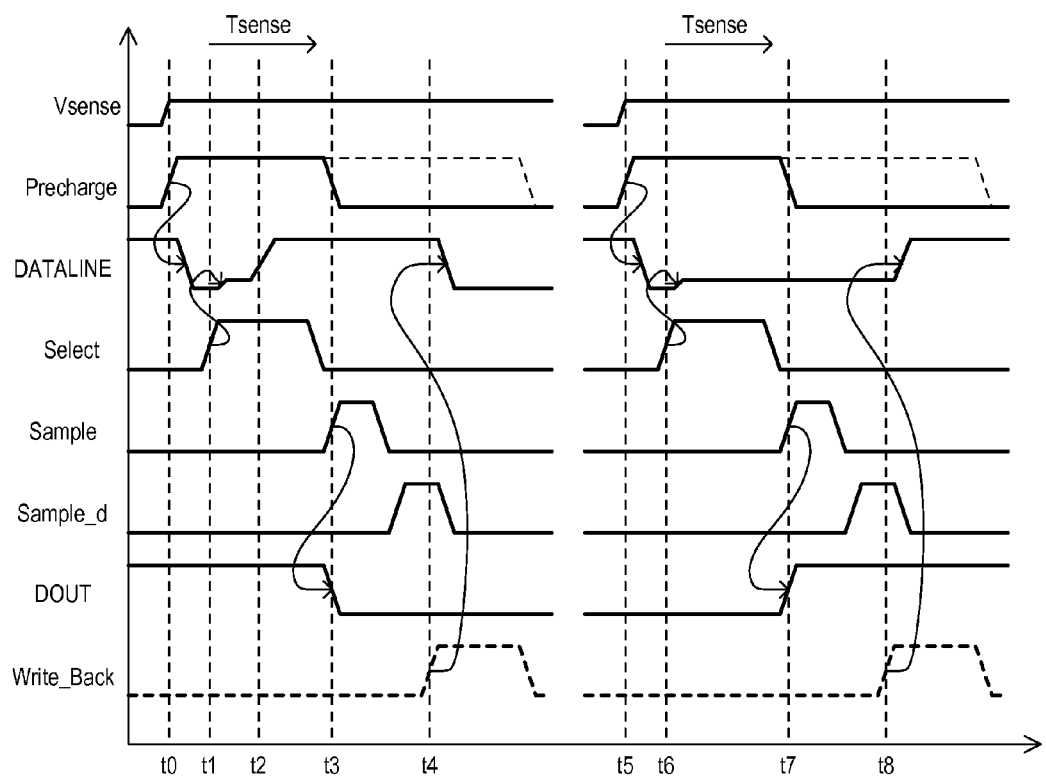
FIG. 9B is a timing diagram showing operations of the memory device of FIG. 9A.

FIG. 9B is a timing diagram showing an operation of the embodiment shown in FIG. 9A. FIG. 9B shows a sensing operations corresponding to two different states of a memory element.

The sense operation from time t0 to t4 shows a sense operation for memory element programmed to have a change in property within a sense time Tsense.

At about time t0, in response to signal Precharge be active (transitioning high), a sense node 926 (DATALINE) can be precharged to VSS.

At about time t1, select device 928 can be enabled, creating sense bias conditions across the memory element 900.

It is assumed that a memory element is in a state that results in a change in property within a sensing time (Tsense). Thus, at about time t2 sense node 926 (DATALINE) rises in potential as memory element 900 changes its properties.

At about time t3, in response to signal Sample being active (transitioning high), sense switch 926 can be enabled, and signal Sample_d can be activated shortly afterward, enabling sense circuit 924 to latch the high value at sense node 926 (DATALINE). As a result, a data out value DOUT can be driven to a logic low.

If a write back circuit 932 is included, at about time t4, in response to signal Write_Back being active (transitioning high), write back circuit 932 can couple an output value (which is low for this case) back to sense node 926 (DATALINE).

The sense operation from times t5 to t8 shows a sense operation for memory element programmed to not undergo a change in property within the sense time Tsense.

At about time t5, a sense node 926 (DATALINE) can be precharged to VSS by operation of signal Precharge.

At about time t6, by operation of signal Select, select device 928 can be enabled, creating sense bias conditions across the memory element 900. As noted above, it is assumed that a memory element 900 is in a state that does not result in a change in property within a sensing time (Tsense). Consequently, sense node 926 (DATALINE) remains at a low potential, as memory element 900 does not undergo any substantial change in state.

At about time t7, by operation of signals Sample/Sample_d, sense switch 926 can be enabled, and sense circuit 924 can latch the low value at sense node 926 (DATALINE). As a result, a data out value DOUT can be a logic high.

If a write back circuit 932 is included, at about time t8, in response to signal Write_Back, write back circuit 932 can couple an output value (which is high for this case) back to sense node 926 (DATALINE). It is noted that such an operation, a logic high value can be higher in potential than Vsense. Consequently, such a write back operation can produce a potential across the memory element 900 opposite to that occurring in the sensing operation occurring between times t0 and t4.

Having described various sense operations and circuits for memory devices according to various embodiments, program operations according to embodiments will now be described. It is understood that as utilized herein, the term "program" is intended to describe operations that establish one state for a memory element.

According to some embodiments, program operations can include the application of voltage and/or current pulses to a memory element that have been derived by characterizing element response.

According to other embodiments, program operations can include the application of voltage and/or current pulses to a memory element followed by verification sense operations to ensure memory elements have a given property change response.

In still other embodiments, other programming variations can be employed, as will be described in more detail below.

Figure 10:
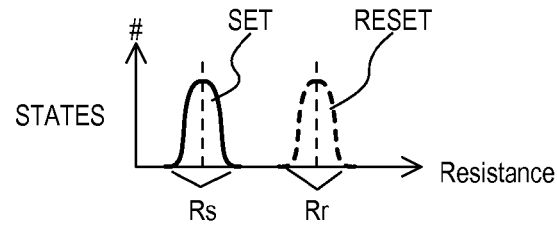
FIG. 10 is a graph showing a distribution of elements in different states according to an embodiment.

Examples of programming operations will now be described with reference to FIGS. 10 to 11B. It is understood that the distributions shown in FIGS. 10 to 11B are for illustration purposes only. Distributions can vary according to device type, desired device response, production lot, etc.

FIG. 10 is a graph showing a distribution of elements (#) in different states (SET, RESET). In the embodiment shown, memory elements can be programmed to have conductance change times that correlate with their sensed resistance. Accordingly, memory elements can be placed into different states by applying electrical conditions that result in a memory element having a resistance within a particular range.

In the embodiment shown, an element programmed to a resistance range Rs can have a SET state, and will undergo a change in conductance within a sense period. However, an element programmed to a resistance range Rr can have a RESET state, and will not undergo a change in conductance within a sense period.

Figure 11A:
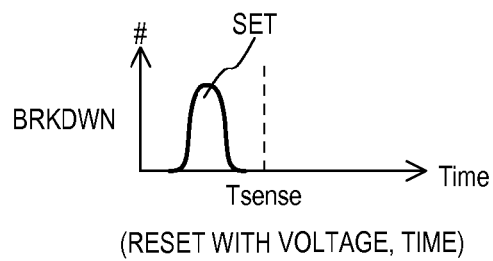
FIGS. 11A and 11B are graphs showing programming operations of memory elements according to embodiments.
Figure 11B:
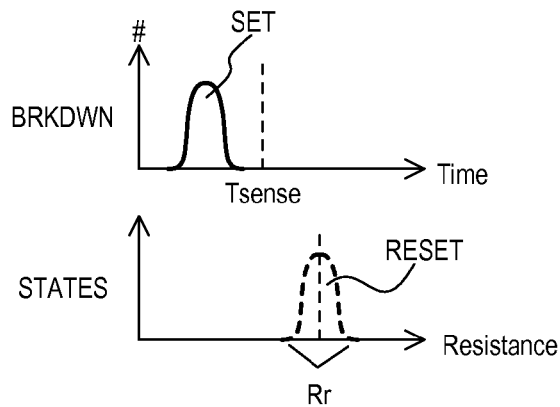

FIG. 11A is a graphs showing a programming operation that establishes one state by the application of a voltage over time. FIG. 11A shows a distribution of memory element breakdown times BRKDWN (i.e., changes in property). In the embodiment shown, elements can be programmed to one state (SET), by applying electrical conditions understood to cause such elements to have a change in conductance within a sense period (Tsense). However, elements can be programmed to another state (RESET) by application of a voltage for a predetermined time. Such an approach can be a "blind" RESET programming. That is, when a reset voltage is applied for the predetermined time, elements will not exhibit a change in property (i.e., breakdown) within the sense period Tsense.

FIG. 11B shows a programming operation that establishes one state according to a resistance.

In the embodiment shown, elements can be programmed to one state (SET) state, by applying electrical conditions understood to cause such elements to change in conductance within a sense period. However, elements can be programmed to another state (RESET state) in the manner shown by FIG. 10. That is, conditions can be applied to the elements until they have a resistance within a given range Rr. Once such elements have a resistance Rr, under sense conditions, they will not exhibit a change in property before a sense period Tsense.

While some of the above embodiments have shown two states for a memory element, as noted above, memory elements can be programmed to more than two states, with each state having a different change-in-property time under the same sense bias conditions.

Figure 12:
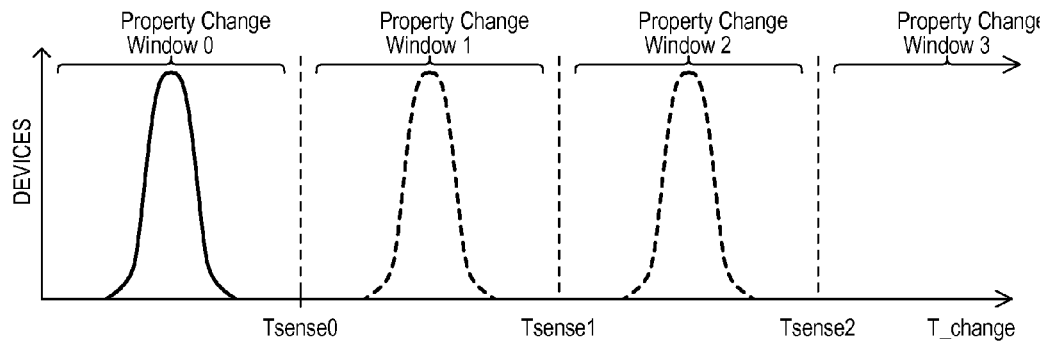
FIG. 12 is a graph showing a distribution of elements in different states according to a further embodiment.

FIG. 12 shows possible states for memory elements according to one particular embodiment. FIG. 12 is a graph showing distributions of programmed memory elements, where each distribution represents a different property change window based on a resulting time to induce a change in property (T_Change). A memory element can be programmed into one change property window according to a data value to be stored (a write data value). Subsequently, different sense times (Tsense0, Tsense1, Tsense2) can be utilized to sense one of many stored data values.

In more detail, in a sense operation for devices behaving as shown in FIG. 12, under sense bias conditions, if a memory element has a change in property within Tsense0, it can be determined to store one data value (e.g., "00"). If a memory element does not change in property within Tsense0, but does so by Tsense1, it can be determined to store a second data value (e.g., "01"). If a memory element does not have a change in property by time Tsense1, but does so by Tsense2, it can be determined to store a third data value (e.g., "10"). Lastly, if a memory element does not have a change in property by time Tsense2, it can be determined to store a fourth data value (e.g., "11").

Figure 13:
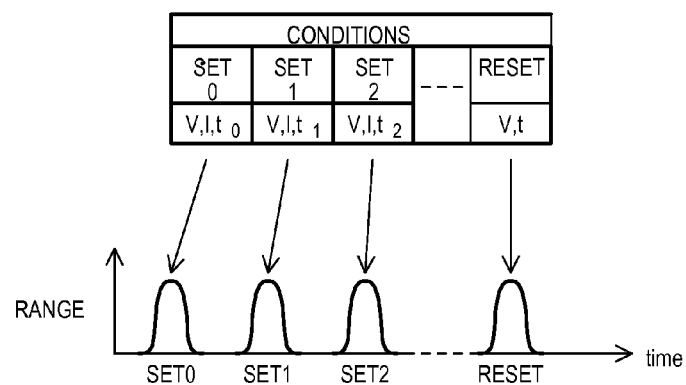
FIG. 13 shows programming methods for achieving different memory element states according to an embodiment.

FIG. 13 shows one approach to achieving different states in a memory device (i.e., different times-to-changes in property). In the embodiment shown, memory elements can be placed into any of various states SET0, SET1, SET2 . . . RESET.

As shown by the table in FIG. 13, states SET0, 1, 2 can be achieved by applying different voltage, current, and time combinations. It is understood that such voltages and/or currents can be static or can be dynamic. However, one state (RESET) can be established by an application of a voltage over time, without regard to current. In one embodiment, a RESET state can correspond to a state in which a change in conductance will not occur within a maximum sensing time period.

Figure 14A:
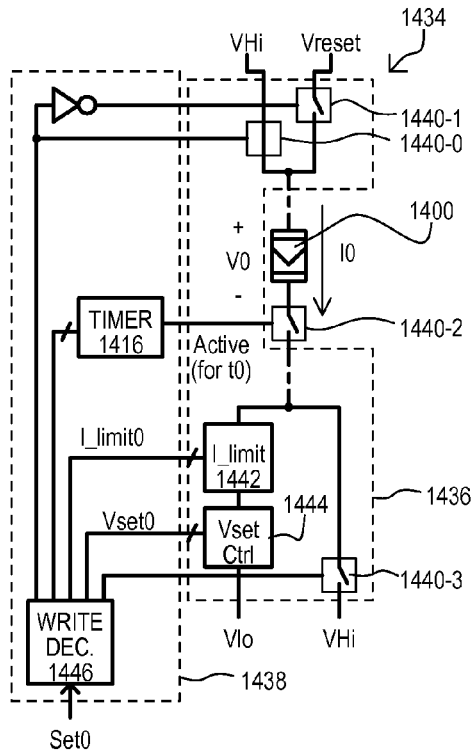
FIGS. 14A to 14C are a sequence of block schematic diagrams showing operations of a programming circuit according to an embodiment.
Figure 14B:
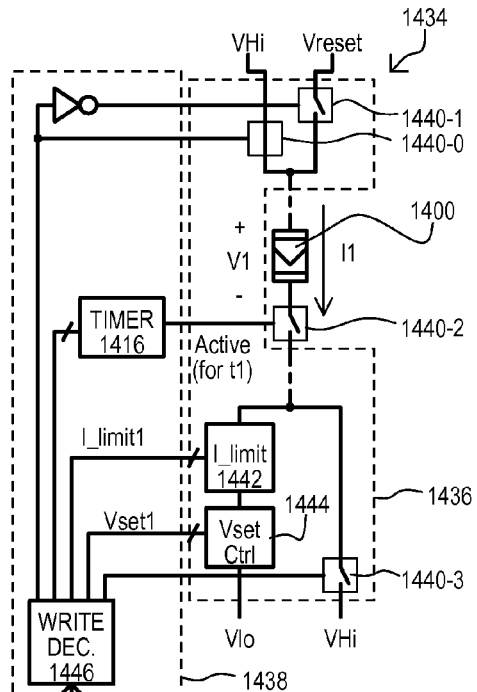
Figure 14C:
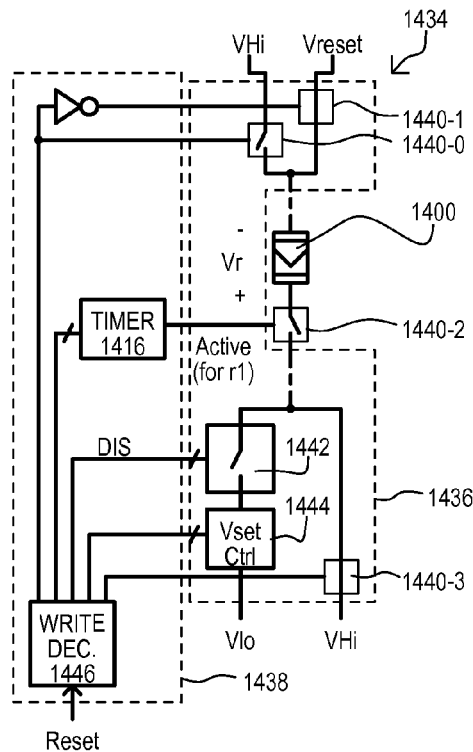

FIGS. 14A to 14C show a programming circuit 1434 and programming operations according to embodiments. Programming circuit 1434 can program memory elements (one shown as 1400) to different time-to-property-change states as described in the embodiments herein, and equivalents.

A programming circuit 1434 can include program biasing section 1436 and a program control section 1438. A program biasing section 1436 can apply electrical conditions that establish a state of an element 1400. In the embodiment shown, a programming biasing section 1436 can include program switches 1440-0 to -3, current limit circuit 1442, and a voltage control circuit 1444.

A program control section 1438 can control the operation of program biasing section 1436. A program control section 1438 can include a timer 1416 and a write data decoder 1446.

FIG. 14A shows a programming of element 1400 to a first state (Set0). In response to an input write data value "Set0", write data decoder 1446 can initially enable program switch 1440-0, and disable program switches 1440-1 and -3. In addition, a write data decoder 1446 can issue control values (I_limit0 and Vset0) to current limit circuit 1442 and voltage control circuit 1444. Further, write data decoder 1446 can enable program switch 1440-2 for a time t0. It is understood that a time t0 is a duration, and not a point in time.

In response to such values from the write data decoder 1446, program bias section 1436 can place element 1400 between voltage VHI and VLO for the time t0. Further, based on values I_limit0 and Vset0, a voltage control circuit 1444 can control a voltage across element 1400, and current limit circuit 1442 can limit a current flowing through element 1400.

In the embodiment shown, the programming operation causes a voltage V0 to be applied across element 1400 and a current I0 to flow through the element 1400 over a time t0. Such conditions can place element 1400 into a SET0 state that will result in a property change within a first time period Tsense0 under sense bias conditions.

FIG. 14B shows a programming of element 1400 to a second state (Set1). In response to an input write data value "Set1", write data decoder 1446 responds in manner like that of FIG. 14A, however, different control values (I_limit1 and Vset1) are issued. Further, a program switch 1440-2 is activated for a different duration (t1).

In the embodiment shown, the programming operation causes a voltage V1 to be applied across element 1400 and a current I1 to flow through the element 1400 over a time t1. Such conditions can place element 1400 into a SET1 state that will result in a property change within a second time period Tsense1 (which is different than Tsense0) under sense bias conditions.

FIG. 14C shows a programming of element 1400 to a third state (Reset). It is noted that such a programming operation can generate an electric field across element 1400 opposite to that of FIGS. 14A and 14B.

In response to an input write data value "Reset", write data decoder 1446 can initially disable program switch 1440-0, and enable program switches 1440-1 and -3. In addition, a write data decoder 1446 can enable program switch 1440-2 for a time r1. Unlike FIGS. 14A and 14B, write data decoder 1446 can output a disable values (DIS) to current limit circuit 1442, to place such a circuit into a high impedance state.

In response to such values from the write data decoder 1446, program bias section 1436 can place element 1400 between voltage Vreset and VHI (where Vreset<VHI).

In the embodiment shown, the programming operation causes a voltage Vr to be applied across element 1400, where Vr has an opposite polarity to V0 and V1 (of FIGS. 14A and 14B). Such conditions can place element 1400 into a RESET state that will result in no substantial property change within any anticipated sensing time period.

In this way, a programming circuit can apply different combinations of voltages and/or currents, over different time periods to establish different states in a memory element, where each different state corresponds to a different change-in-property time under sense bias conditions.

Memory elements, as described herein, can be included in various memory architectures. Examples of such architectures will now be described.

Figure 15:
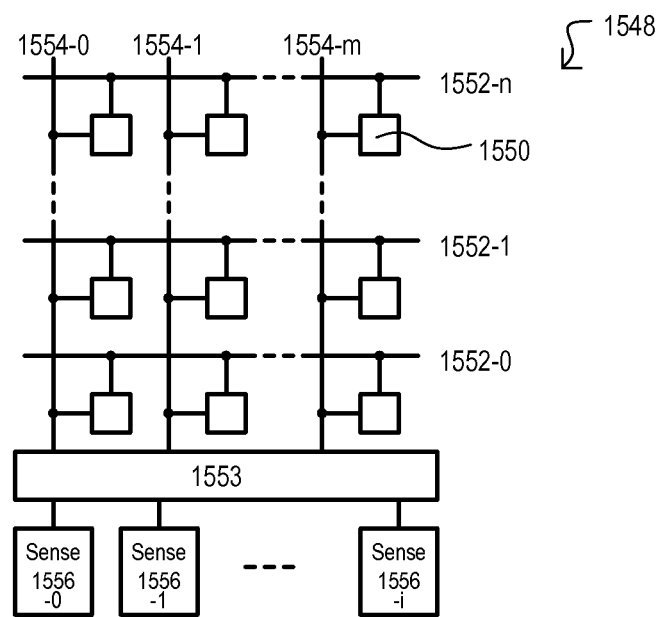
FIG. 15 is a block schematic diagram of a memory device according to an embodiment.

Referring to FIG. 15, a memory device 1548 can include memory cells (one shown as 1550) connected between bias lines 1552-0 to -n and data lines 1554-0 to -m. Data lines (1554-0 to -m) can be connected to sense circuits 1556-0 to -i, which can sense changes in property as described herein and equivalents.

Memory cells (e.g., 1550) can each include one or more memory elements having programmable times-to-change-in-property, as described herein, or equivalents.

Bias lines (1552-0 to -n), in combination with sense circuits (1556-0 to -i), or other bias circuits (not shown), can apply a sense bias across a selected memory element to induce (or not induce—depending upon data value stored) a change in property during a sense operation. In some embodiments, bias lines (1552-0 to -n) can also provide program biasing voltages used to place an element into a particular state.

Data lines (1554-0 to -m) can commonly connect memory cells (e.g., 1550) of a same column to sense circuits (1556-0 to -i) directly, or by way of decoder circuits 1553.

In some embodiments, bias lines (1552-0 to -n) can form part of a same "plate" structure, and so in such embodiments, are conductively connected to one another.

Figure 16:
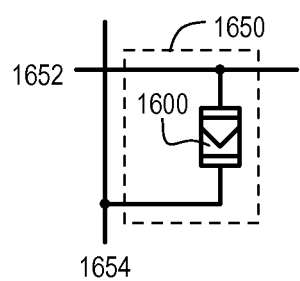
FIG. 16 shows a memory cell that can be included in embodiments.

FIG. 16 shows a memory cell 1650 that can be included in embodiments, including that of FIG. 15. A memory cell 1650 can include a programmable element 1600 having a cross-point array type connection between a data line 1654 and a bias line 1652.

Figure 17:
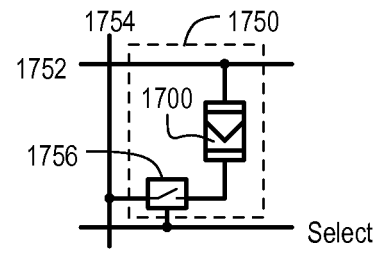
FIG. 17 shows another memory cell that can be included in embodiments.

FIG. 17 shows another memory cell 1750 that can be included in embodiments, including that of FIG. 15. A memory cell 1750 can include a programmable element 1700 and an access device 1756. A bias line 1752 can be connected to one terminal of an element 1700, while a second terminal of element 1700 can be connected to a data line 1754 by access device 1756.

Memory devices employing time-to-change-in-property elements, like those described herein or equivalents can have various applications, including memory integrated circuit (IC) devices suitable for replacing conventional memory ICs, such as dynamic RAMs, static RAMs, EEPROMs (including "flash" EEPROMs), and "embedded" memories.

In some embodiments, time-to-change in property elements can store data values in the absence of applied power (e.g., are nonvolatile), or can require rewriting data only over relatively long periods of time.

Memory elements having different property change times can be utilized in different types of devices. Two particular embodiments are shown in FIG. 18.

Figure 18:
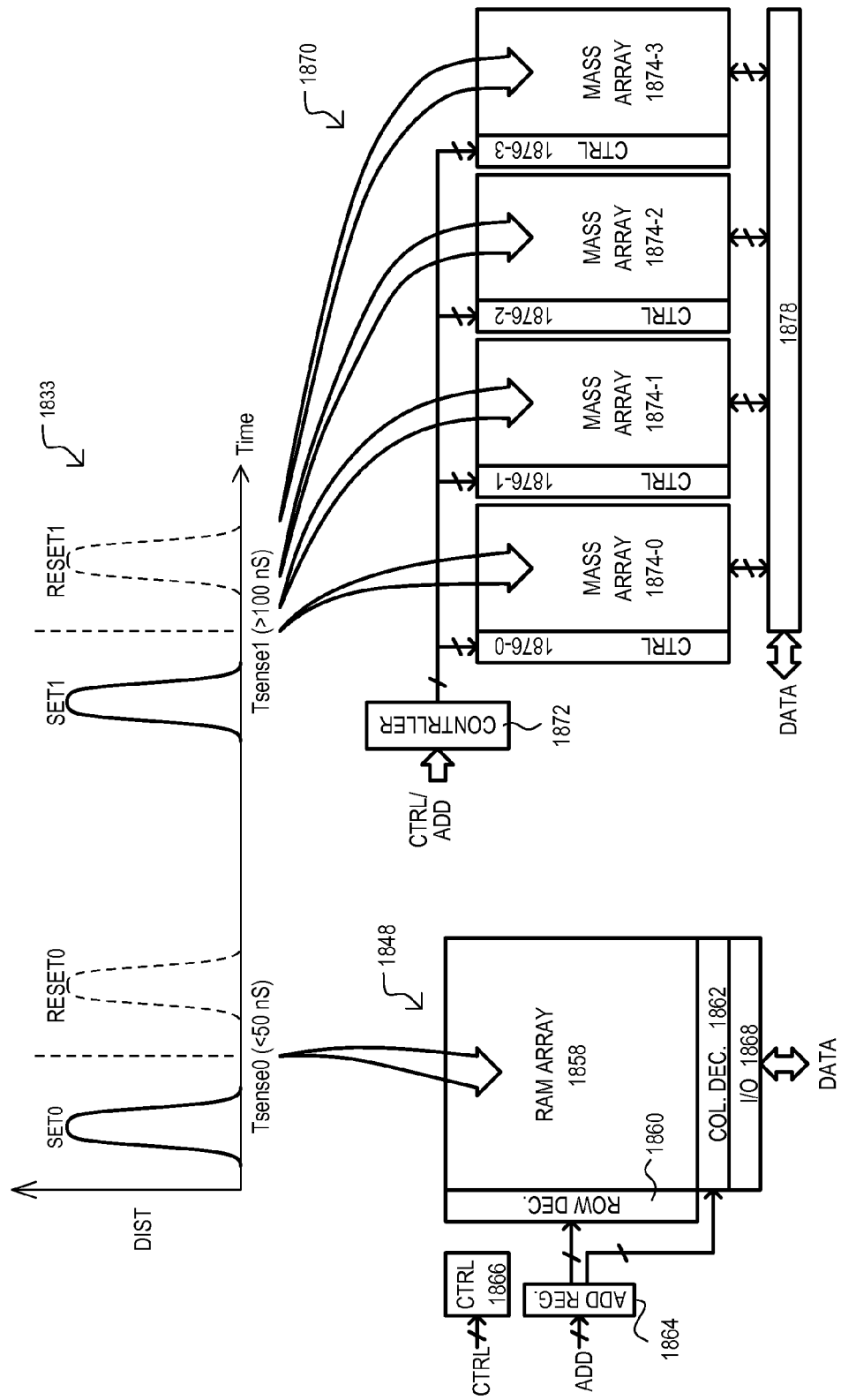
FIG. 18 is a diagram showing how memory cells can be included in different types of memory devices.

FIG. 18 includes a graph 1833 showing how memory elements can be programmed to a first state (SET0) with a relatively short time-to-change in property (and hence be sensed at Tsense0), while other elements can be programmed to a second state (SET1) having a relatively longer time-to-change in property (and hence be sensed at Tsense1). In some embodiments a relatively short sense time (Tsense0) can be no more than about 50 ns, more particularly less than about 25 ns, even more particularly no more than about 10 ns. In contrast, a relatively longer sense time (Tsense1) can be no less than about 100 ns, more particularly no less than about 250 ns, even more particularly, no less than about 500 ns.

Elements programmable to relatively short sense times can be included in a random access memory (RAM) type device 1848. A RAM device 1848 can include one or more memory arrays accessible in a random fashion via an applied address value (ADD). That is, according to an applied address, a data byte, word, double word, or other data unit can be accessed and output as read data. In some embodiments, such accesses can include "burst" accesses in which sequences of such data units can be output based on a single address ADD.

In the particular embodiment shown, RAM device 1848 can include a memory array 1858, a row decoder 1860, a column decoder 1862, an address register 1864, a control circuit 1866, and an input/output (I/O) circuit 1868. A memory array 1858 can include memory cells with programmable elements as described herein, and equivalents. Row decoder 1860 can access rows of memory cells while column decoder 1862 can access columns of memory cells. I/O circuit 1868 can include sense circuits and/or program circuits. Sense circuits can sense data values from accessed memory cells by detecting the occurrence (or non-occurrence) of a change in property within a sense time period. Program circuits can program elements within accessed memory cells to have a particular time-to-change-in-property response.

Elements programmable to a relatively long sense time can be included in a mass storage type device 1870. A mass storage device 1870 can include large arrays of memory cells, and can transfer data in relatively large groups for output from the device. That is, in an access operation, data can be output in a parallel fashion from multiple arrays.

In the particular embodiment shown, mass storage device 1870 can include mass storage arrays 1874-0 to -3, a controller 1872, array control circuitry 1876-0 to -3, and an I/O path 1878. Mass storage arrays 1874-0 to -3 can include large numbers of memory cells (e.g., multiple gigabits), and can undergo data transfers to I/O path 1878. A controller 1872 can control data transfers in response to control and address information.

In this way, programmable elements having relatively short sense times can be included in RAM devices, while programmable elements having relatively long sense times can be included in mass storage devices.

Figure 19:
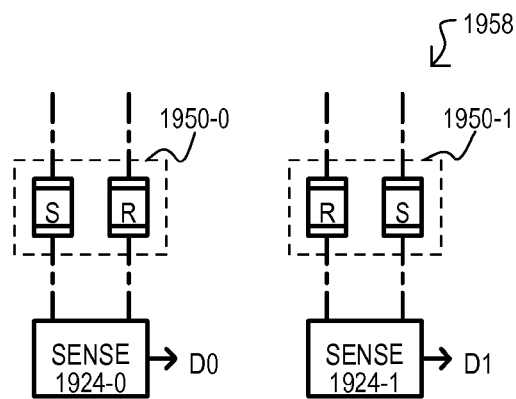
FIG. 19 is a block schematic diagram showing a memory device according to a further embodiment.

FIG. 19 shows a memory device 1958 according to a further embodiment. A memory device 1958 can store data value with pairs of programmable elements programmed to different time-to-change-in-property states. Accordingly, under applied sense conditions, a first of the elements can undergo a change in property while a second of the elements does not undergo such a change, or undergoes such a change after the first element.

It is noted that a memory device having such opposing state programming can be conceptualized as including a relative time-to-change data storage approach. The time required to determine a stored state for one element is relative to the other element of the same pair, and not an absolute time period. Such an arrangement can have less stringent programming requirements as compared to approaches relying on an absolute sensing time period.

In the embodiment shown, memory cells 1950-0/1 can include two elements, each programmed to different states (S and R). Sense circuits 1924-0/1 can generate data values D0/D1 that vary in response to which element of a pair has a change in property first.

Figure 20:
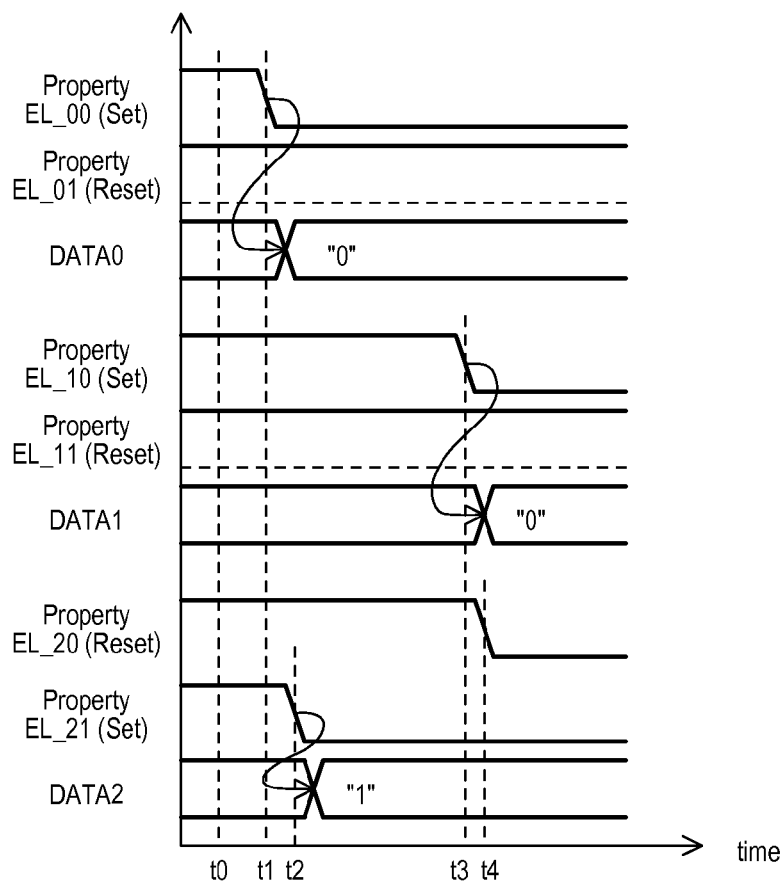
FIG. 20 is a timing diagram showing an operation of a memory device like that of FIG. 19.

FIG. 20 is a timing diagram showing an operation of a memory device like that shown in FIG. 19. FIG. 20 shows waveforms corresponding to the properties of element pairs (EL_00/EL_01, EL_10/EL_11, EL_20/EL_21) of a same memory cell in a sense operation, as well as a corresponding data value (DATA0, DATA1, DATA2) generated from the sensing operation.

At about time t0 a sense operation can start. This can include sense biasing conditions being applied across the elements of the three memory cells.

At about time t1, within a first memory cell (that includes element pair EL_00/EL_01), a first element (EL_00) of the memory cell undergoes a change in property, while a corresponding second element (EL_01) does not undergo such a change. Such a response can result in a corresponding data value DATA0 being a logic "0".

At about time t2, within a third memory cell (that includes element pair EL_20/EL_21), a second element (EL_21) of the memory cell undergoes a change in property, while a corresponding first element (EL_20) does not undergo such a change. Such a response can result in a corresponding data value DATA2 being a logic "1".

At about time t3, within a second memory cell (that includes element pair EL_10/EL_11), a first element (EL_10) of the memory cell undergoes a change in property, while a corresponding second element (EL_11) does not undergo such a change. Such a response can result in a corresponding data value DATA1 being a logic "0".

At about time t4, within the third memory cell, a first element (EL_20) of the memory cell undergoes a change in property. However, because a second element (EL_21) had already undergone such a change, value DATA2 remains a logic "1".

Figure 21:
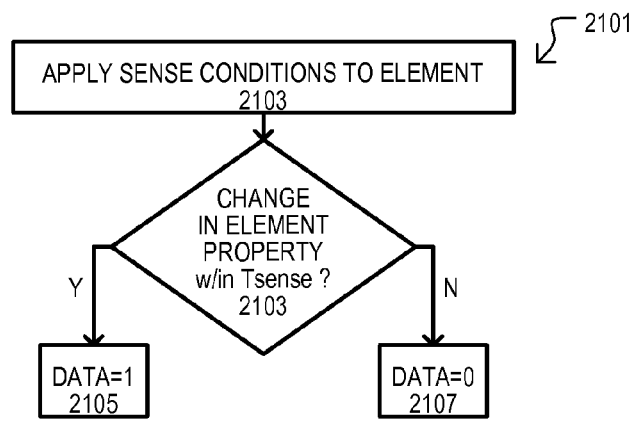
FIG. 21 is a flow diagram of a method according to one embodiment.

FIG. 21 is a flow diagram of a method 2101 according to one embodiment. A method 2101 can include applying sense conditions to an element (2103). Such an action can include applying electrical conditions to a memory element.

If there is a change in an element property within a time Tsense (Y from 2103), data can have one value (in this embodiment "1") (2105). If there is not a change in the element's property within a time Tsense (N from 2103), data can have another value (in this embodiment "0") (2107).

Figure 22:
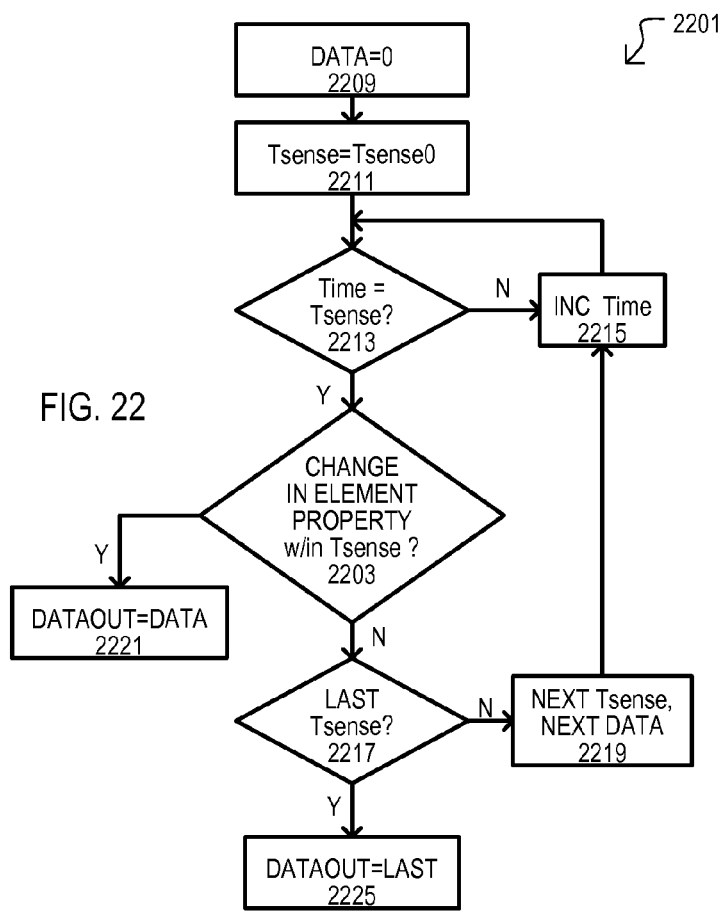
FIG. 22 is a flow diagram of a method according to another embodiment.

FIG. 22 is a flow diagram of a method 2201 of sensing multiple property-change times according to an embodiment. A sense data value can have an initial value (in this case DATA=0) (2209). A sense time Tsense can also have an initial value (in this case Tsense0) (2211).

If a sense time has not passed (N from 2213), a time can be incremented (2215). If a sense time has been reached (Y from 2213), a check can be made for a property change in an element (2203).

If a change in property has occurred (Y from 2203), an output data value can be a present data value (2221). However, if a change in property has not occurred (N from 2203), and if it is not a last sense time (N from 2217), a sense time can be set to a next sense time, and a data value can be changed to a next data value (2219) and a method can return to step 2215.

If it is a last sense time (Y from 2217), an output data value can be a last data value (2225).

Figure 23:
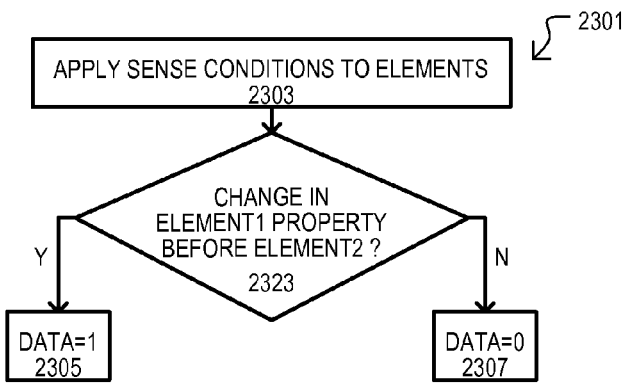
FIG. 23 is a flow diagram of a method according to a further embodiment.

FIG. 23 is a flow diagram of a method 2301 for sensing a relative change in property between two elements according to one embodiment. A method 2301 can include applying sense conditions to elements (2303). Such an action can include applying electrical conditions to a pair of memory elements.

If there is a change in property in a first element before a second element (Y from 2323), data can have one value (in this embodiment "1") (2305). If there is not change in property in a first element before a second element (N from 2323), data can have another value (in this embodiment "0") (2307).

Figure 24:
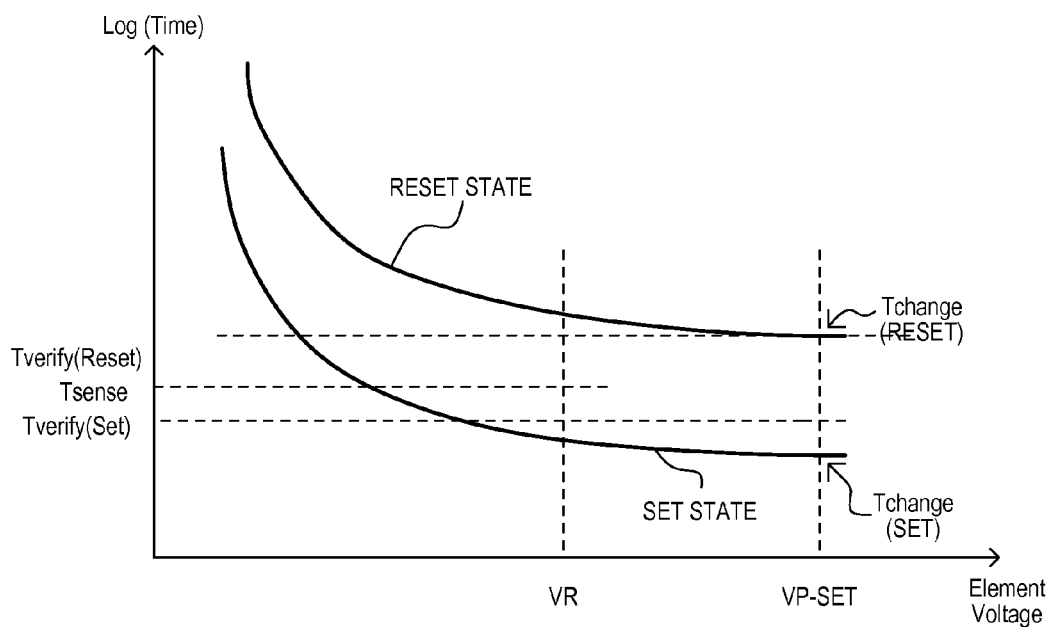
FIG. 24 is a graph of showing programming, reading and sensing of memory elements according to an embodiment.

FIG. 24 is a graph of showing programming, reading and sensing changes in properties for memory elements according to an embodiment. A horizontal axis can correspond to a voltage applied across an element. A vertical axis can correspond to a time to change in property (on a logarithmic scale).

Memory elements can be programmed into a SET or a RESET state. In the graph shown, Tchange (RESET) can be the time required to place an element into a "reset" state with a program voltage VP-SET. Tchange (SET) can be the time required to place an element into a "set" state with a program voltage VP-SET, the set state having a faster time to change in property than the reset state.

Tsense can be as described in other embodiments above: a sensing threshold time utilized to distinguish between the two states and a sense voltage VR which is less than a program voltage VP-SET.

FIG. 24 also shows Tverify(Reset) and Tverify(Set). Such values can enable a state of elements to be verified following a program operation.

A memory device and method according to the embodiments can be included in a standalone memory device (i.e., a memory device providing substantially only storage functions). In alternate embodiments, such a memory device can be embedded into larger integrated circuit device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention can be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
    determining a data value stored in a memory element of a memory cell array based on the length of time required to cause a property of the memory element to change.

2. The method of claim 1, wherein:
    the length of time is a predetermined time period based on a timing circuit.

3. The method of claim 1, wherein:
    the length of time is relative to another length of time required to cause a property of a second memory element to change or not to change.

4. The method of claim 1, wherein:
    the memory element is a two terminal memory element.

5. The method of claim 1, wherein:
    the memory element comprises a mobile ion conducting material formed between two electrodes.

6. The method of claim 5, wherein:
    the mobile ion conducting material comprises a chalcogenide.

7. The method of claim 5, wherein:
    the mobile ion conducting material comprises a transition metal oxide.

8. The method of claim 1, wherein:
    determining the data value includes sensing if a voltage change has occurred across the memory element within the length of time.

9. The method of claim 1, wherein:
    determining the data value includes sensing if a current change has occurred across through the memory element within the length of time.

* * * * *